US011435269B1

(12) United States Patent
Benyhesan et al.

(10) Patent No.: US 11,435,269 B1
(45) Date of Patent: Sep. 6, 2022

(54) IN SITU DATA ACQUISITION AND REAL-TIME ANALYSIS SYSTEM

(71) Applicant: HONEYWELL FEDERAL MANUFACTURING & TECHNOLOGIES, LLC, Kansas City, MO (US)

(72) Inventors: Mohammad K. Benyhesan, Kansas City, MO (US); Richard W. Spengemann, II, Lee's Summit, MO (US)

(73) Assignee: HONEYWELL FEDERAL MANUFACTURINGS TECHNOLOGIES, LLC, Kansas City, MO (US)

( * ) Notice: Subject to any disclaimer, the term of this patent is extended or adjusted under 35 U.S.C. 154(b) by 918 days.

(21) Appl. No.: 16/238,702

(22) Filed: Jan. 3, 2019

(51) Int. Cl.
| | |
|---|---|
| *G01N 3/00* | (2006.01) |
| *G01N 3/02* | (2006.01) |
| *G06F 1/26* | (2006.01) |
| *G01N 3/34* | (2006.01) |
| *G01R 15/12* | (2006.01) |
| *G01N 29/07* | (2006.01) |

(52) U.S. Cl.
CPC ............... *G01N 3/02* (2013.01); *G01N 3/34* (2013.01); *G01R 15/12* (2013.01); *G06F 1/26* (2013.01); *G01N 29/075* (2013.01); *G01N 2203/0037* (2013.01); *G01N 2203/0202* (2013.01)

(58) Field of Classification Search
CPC .............. G01N 3/02; G01N 2203/003; G01N 2203/0092; G01N 2203/0228
See application file for complete search history.

(56) References Cited

U.S. PATENT DOCUMENTS

| | | | |
|---|---|---|---|
| 4,821,217 A | 4/1989 | Jackson et al. | |
| 5,606,533 A | 2/1997 | Cranford et al. | |
| 5,859,964 A | 1/1999 | Wang et al. | |
| 6,591,121 B1* | 7/2003 | Madarasz | A61B 5/14558 600/316 |
| 8,547,110 B2 | 10/2013 | Kesil et al. | |
| 11,379,859 B1* | 7/2022 | Powers | G06Q 30/0201 |
| 2007/0252717 A1* | 11/2007 | Fielder | F04D 13/10 417/63 |

(Continued)

OTHER PUBLICATIONS

KLA-Tencor webpage: https://www.kla-tencor.com/products/chip-manufacturing/in-situ-process-management.html?doc=manuals/TT5UM.pdf.

*Primary Examiner* — Max H Noori
(74) *Attorney, Agent, or Firm* — Hovey Williams LLP

(57) ABSTRACT

A testing system for evaluating the performance of an electrical/electronic UUT under dynamic operating conditions. The testing system includes a dynamic testing component (e.g., a centrifuge) for applying a stimulus to the UUT, and an iDAQ system configured to perform in situ data acquisition and real-time data analysis. The iDAQ system may also be subject to the stimulus. The iDAQ system includes a processor (e.g., an SoC) component, a power supply, a CR/I component, an IR component, and a single enclosure. The processor component may control the dynamic testing component, including varying in real-time the stimulus applied to the UUT. The processor component may include multiple input channels, and a high current/voltage subcomponent of the power supply may be configured to supply up to five hundred volts.

20 Claims, 5 Drawing Sheets

(56) References Cited

U.S. PATENT DOCUMENTS

| | | | |
|---|---|---|---|
| 2011/0046970 A1* | 2/2011 | Fontenot | G16H 40/67 705/14.66 |
| 2014/0368378 A1* | 12/2014 | Crain | G01S 13/9089 342/25 A |
| 2015/0059432 A1* | 3/2015 | Zhuge | G01D 18/00 73/1.82 |
| 2018/0276376 A1* | 9/2018 | Lim | H04L 63/1425 |
| 2019/0324443 A1* | 10/2019 | Cella | G05B 19/4184 |
| 2020/0150645 A1* | 5/2020 | Cella | G05B 19/41875 |
| 2020/0348273 A1* | 11/2020 | Michaud | H01J 49/0036 |
| 2022/0120714 A1* | 4/2022 | Xie | B61L 25/021 |
| 2022/0164975 A1* | 5/2022 | Kato | G06T 7/00 |

\* cited by examiner

IN SITU DATA ACQUISITION AND REAL-TIME ANALYSIS SYSTEM

STATEMENT REGARDING FEDERALLY-SPONSORED RESEARCH OR DEVELOPMENT

This invention was made with government support under Contract No.: DE-NA-0002839 awarded by the Department of Energy. The government has certain rights in the invention.

FIELD

The present invention relates to systems and methods for testing products, and more particularly, embodiments concern a testing system for evaluating the performance of electrical/electronic products under dynamic operating conditions, including a data acquisition and analysis system configured to perform in situ data acquisition and real-time data analysis.

BACKGROUND

It is often desirable to measure and analyze the performance of electrical/electronic products. Prior art solutions include Fluke Calibration Systems such as Super DAQ and DAQ-STAQ which record performance data without any analysis processes and with only pre-defined stimulus values. The data collected from such systems require post-processing software to perform the analysis, and the systems cannot supply multiple event-based and real-time stimuli. In addition to having limited capabilities, these systems are undesirably large. Other prior art systems include the TIDA-00440 board from Texas Instruments which can measure leakage current by applying five hundred volts for only two terminals. However, this board cannot be used to measure the leakage current of products with multiple resistive channels and it cannot be combined with other data acquisition systems.

This background discussion is intended to provide information related to the present invention which is not necessarily prior art.

SUMMARY

Embodiments of the present invention address the above-described and other problems and limitations in the prior art by providing an improved testing system for evaluating the performance of electrical/electronic components, circuits, systems, or other products under dynamic operating conditions, including a data acquisition and analysis system configured to perform in situ data acquisition and real-time data analysis. In some implementations, the data acquisition and analysis system may control the dynamic testing conditions and/or may also be subject to the dynamic operating conditions.

In a first embodiment, a data acquisition and analysis system is provided for improving the testing of a product unit, including performing in situ acquisition of data for the product unit, while a dynamic testing component applies a stimulus to the product unit, and real-time analysis of the data. The data acquisition and analysis system may include a processor component, a power supply, a circuit resistance/interface component, an insulation resistance component and a single enclosure. The processor component may be configured to control in real-time the in situ acquisition of the data, to perform in real-time the in-situ acquisition of the data, and to perform the real-time analysis of the data. The power supply may include a high current/voltage subcomponent and a low current/voltage subcomponent. The circuit resistance/interface component may be electrically connected to the processor component and the power supply and configured to acquire first data from the product unit, including first data regarding an electrical resistance for the product unit, while the stimulus is applied to the product unit, and to communicate the first data to the processor component for the real-time analysis. The insulation resistance component may be electrically connected to the processor component and the power supply and configured to acquire second data from the product unit, including second data regarding an electrical insulation integrity for the product unit, while the stimulus is applied to the product unit, and to communicate the second data to the processor component for the real-time analysis. The single enclosure may physically enclose the processor component, the power supply, the circuit resistance/interface component, and the insulation resistance component.

Various implementations of the first embodiment may include any one or more of the following features. The dynamic testing component may be a centrifuge configured to apply a centrifugal force to the product unit. The stimulus may also be applied to the data acquisition and analysis system. The processor component may be a system-on-chip. The processor component may be further configured to control the dynamic testing component, including varying in real-time the stimulus applied to the product unit. The processor component may include multiple input channels configured to receive in real-time the data. The high current/voltage subcomponent of the power supply may be configured to supply up to five hundred volts, and the data acquisition and analysis system may be further configured to measure on multiple input channels a leakage current of the product unit. The data acquisition and analysis system may further include a transceiver configured to transmit and receive information into and out of the testing system via a communication network, including information for controlling the dynamic testing component and the data acquisition and analysis system.

In a second embodiment, a testing system is provided for improving the testing of a product unit, including performing in situ acquisition of data and real-time analysis of the data. The testing system may include a dynamic testing component and a data acquisition and analysis component. The dynamic testing component may be configured to apply a stimulus to the product unit. The data acquisition and analysis system may be configured to perform the in situ acquisition of the data and the real-time analysis of the data, and may include a system-on-chip component, a power supply, a circuit resistance/interface component, an insulation component, and a single enclosure. The system-on-chip component may be configured to control in real-time the in situ acquisition of the data, to perform in real-time the in-situ acquisition of the data, and to perform the real-time analysis of the data. The power supply may include a high current/voltage subcomponent and a low current/voltage subcomponent. The circuit resistance/interface component may be electrically connected to the system-on-chip component and the power supply and configured to acquire first data from the product unit, including first data regarding an electrical resistance for the product unit, while the stimulus is applied to the product unit, and to communicate the first data to the system-on-chip component for the real-time analysis. The insulation resistance component may be electrically connected to the system-on-chip component and the power supply and configured to acquire second data from the product unit, including second data regarding an electrical insulation integrity for the product unit, while the stimulus is applied to the product unit, and to communicate the second data to the system-on-chip component for the real-time analysis. The single enclosure may physically enclose the system-on-chip component, the power supply, the circuit resistance/interface component, and the insulation resistance component.

Various implementations of the second embodiment may include any one or more of the following features. The dynamic testing component may be a centrifuge configured to apply a centrifugal force to the product unit. The stimulus may also be applied to the data acquisition and analysis system. The system-on-chip component may be further configured to control the dynamic testing component, including varying in real-time the stimulus applied to the product unit. The system-on-chip component may include multiple input channels configured to receive in real-time the data. The high current/voltage subcomponent of the power supply may be configured to supply up to five hundred volts, and the data acquisition and analysis system may be further configured to measure on multiple input channels a leakage current of the product unit. The testing system may further include a transceiver configured to transmit and receive information into and out of the testing system via a communication network, including information for controlling the dynamic testing component and the data acquisition and analysis system.

This summary is not intended to identify essential features of the present invention, and is not intended to be used to limit the scope of the claims. These and other aspects of the present invention are described below in greater detail.

DRAWINGS

Embodiments of the present invention are described in detail below with reference to the attached drawing figures, wherein.

Figure 1:
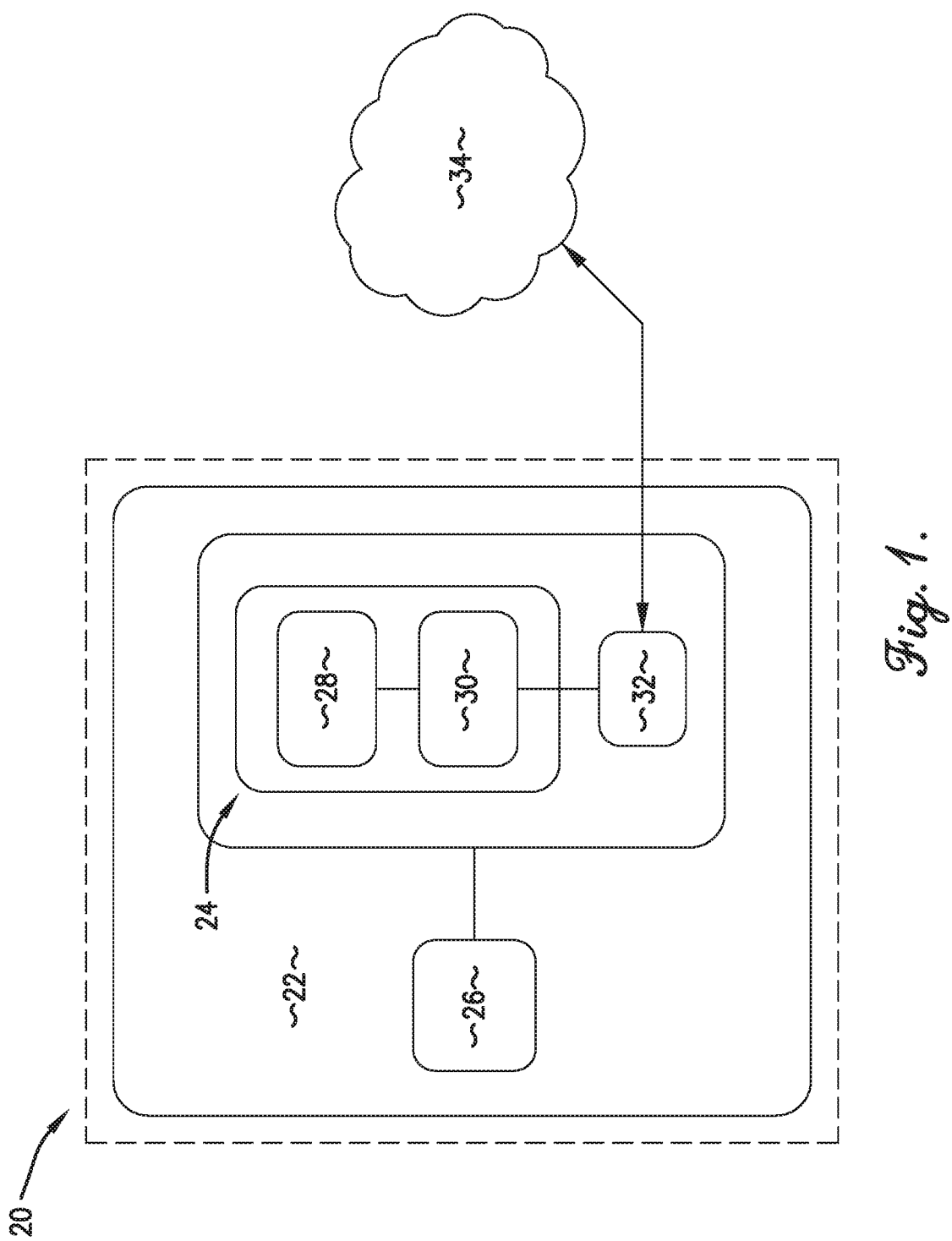
FIG. 1 is a high-level block diagram of an embodiment of a testing system for a unit under test, including a dynamic testing component and a data acquisition and analysis system configured to perform in situ data acquisition and real-time data analysis.

The figures are not intended to limit the present invention to the specific embodiments they depict. The drawings are not necessarily to scale.

DETAILED DESCRIPTION

The following detailed description of embodiments of the invention references the accompanying figures. The embodiments are intended to describe aspects of the invention in sufficient detail to enable those with ordinary skill in the art to practice the invention. Other embodiments may be utilized and changes may be made without departing from the scope of the claims. The following description is, therefore, not limiting. The scope of the present invention is defined only by the appended claims, along with the full scope of equivalents to which such claims are entitled.

In this description, references to "one embodiment," "an embodiment," or "embodiments" mean that the feature or features referred to are included in at least one embodiment of the invention. Separate references to "one embodiment," "an embodiment," or "embodiments" in this description do not necessarily refer to the same embodiment and are not mutually exclusive unless so stated. Specifically, a feature, component, action, step, etc. described in one embodiment may also be included in other embodiments, but is not necessarily included. Thus, particular implementations of the present invention can include a variety of combinations and/or integrations of the embodiments described herein.

Broadly characterized, embodiments provide an improved testing system for evaluating the performance of electrical/electronic components, circuits, systems, or other products under dynamic operating conditions, including a data acquisition and analysis (iDAQ) system configured to perform in situ data acquisition and real-time data analysis. In some implementations, the data acquisition and analysis system may control the dynamic operating conditions and/or may be subject to the dynamic operating conditions. The electrical/electronic products may be substantially any such convention or non-conventional stand-alone, partial, and/or integrated products and may be generally referred to as the unit(s) under test (UUT). Embodiments provide a particular solution to a particular problem in a particular field, and in some implementations, as discussed below, one or more particular machines may be integral to the particular solution.

In various implementations, the iDAQ system may include any of the following features. The iDAQ system may be configured to very accurately measure and record performance on multiple channels, up to 5 channels, and adjust stimulus in real-time, while undergoing dynamic testing (e.g., spinning within a centrifuge) along with the product being tested. The iDAQ and real-time data analysis features may be integrated into the testing setup, including being embedded and located inside an enclosure with multiple input/output ports. The iDAQ feature may provide multiple test capabilities to products with multiple resistive channels. The iDAQ feature may record component performance on multiple channels, and may adjust stimulus values in real-time while dynamic testing is being performed. The iDAQ feature may safely perform high voltage and high current stimulus tests while also accurately measuring small voltage and small current signals. The iDAQ feature may supply up to five hundred volts to measure the leakage current(s) of a component as a whole (up to 16 channels) or of a single channel. The iDAQ feature may have multiple features and test capabilities that can be used inside active dynamic equipment (e.g., centrifuges) to accurately measure the performance of the resistive channels of a Unit Under Test (UUT). The iDAQ feature may use algorithms implemented with the Very High Speed Integrated Circuit Hardware Description Language (VHDL) which allows for direct evaluation of component outputs. In particular, the iDAQ feature may use VHDL code for real-time data acquisition and analysis and real-time stimulus applications with respect to UUT performance events. The iDAQ feature may allow for control of third party off-the-shelf devices, and may incorporate customizable digital design hardware IP Cores Processes (using, e.g., the Xilinx Vivado Suite) and customizable digital design Master Stream Interface code (VHDL code). Thus, embodiments of the iDAQ system provide substantial advantages over prior art DAQ systems, including providing real-time complex test capabilities in a compact and integrated design.

Figure 2:
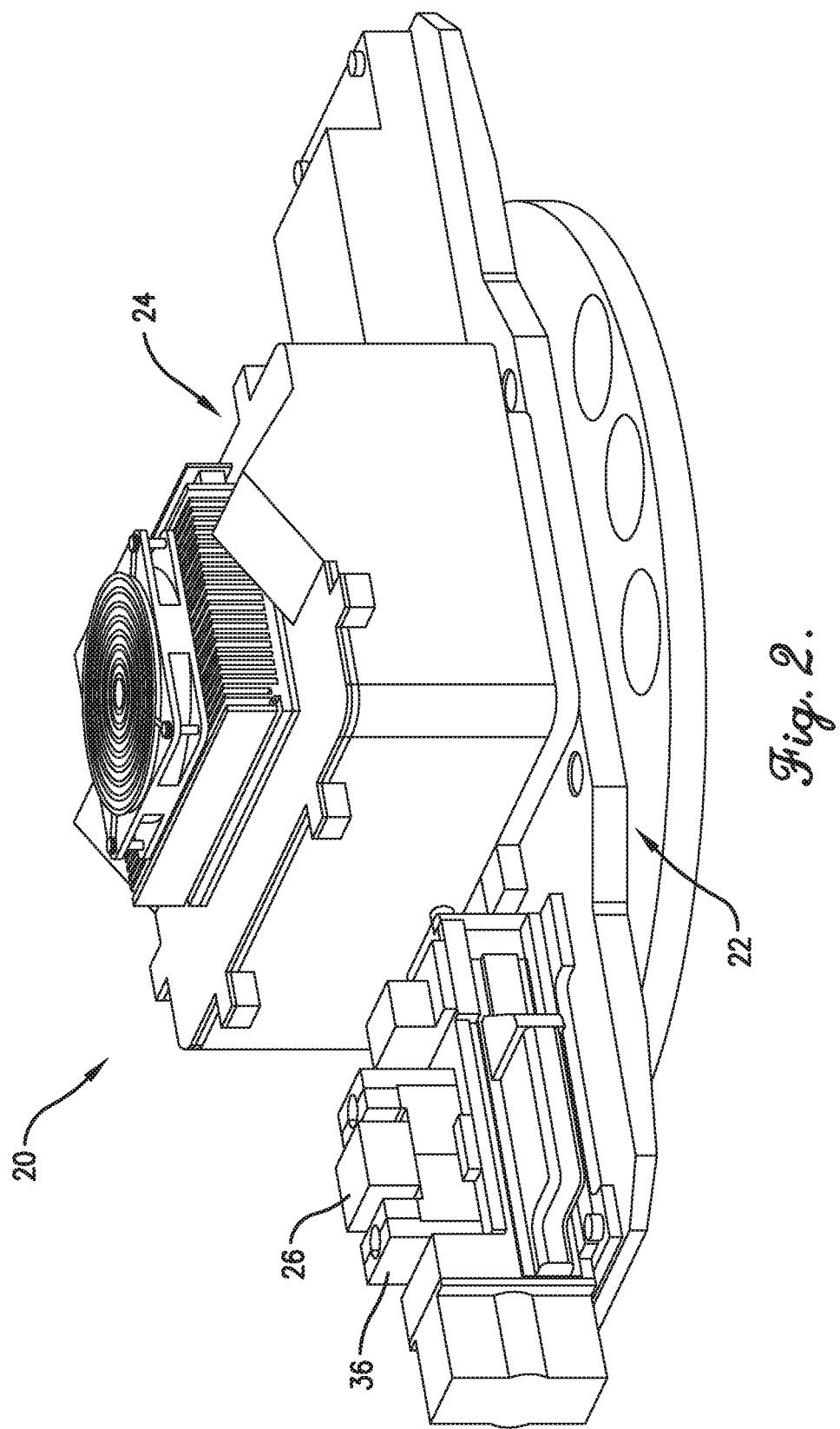
FIG. 2 is an isometric view of an implementation of the testing system of FIG. 1, wherein the dynamic testing component is a centrifuge.

Referring to FIG. 1, an embodiment of a testing system 20 is shown configured to evaluate the performance of and otherwise perform testing on electrical/electronic UUTs and including a dynamic testing component 22 and an iDAQ system 24 configured for in situ testing of a UUT 26. An embodiment of the iDAQ system 24 may include a real-time in situ data acquisition feature 28 and real-time analysis feature 30. A transceiver 32 may be included to allow for transmitting and receiving instructions, data, or other information into and out of the testing system 20 via a communication network 34 (e.g., the Internet). The natures and details of the overall testing system 20 and the dynamic testing component 22 may depend on the natures and details of the UUT 26 and the desired or needed performance measurements and measurement conditions for the UUT 26. As a non-limiting example, the dynamic testing component 22 is shown in FIG. 2 as a centrifuge apparatus, and the testing system 20 includes the iDAQ system 24 and a retention mechanism 36 for the UUT 26, so that the iDAQ system 24 can measure the performance of the UUT 26 as the UUT 26 experiences dynamic centrifugal forces.

Figure 3:
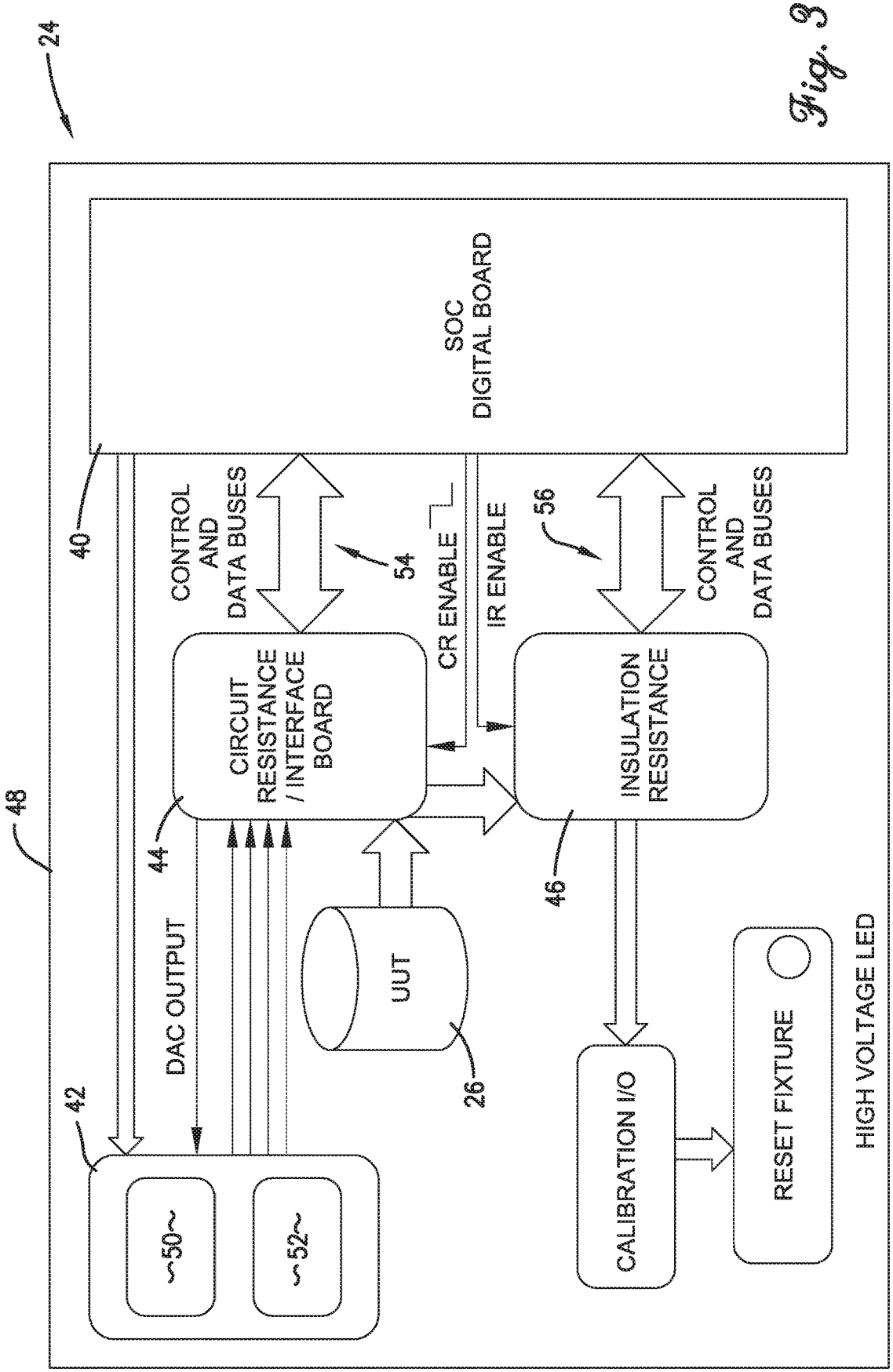
FIG. 3 is a high-level block diagram of an implementation of the data acquisition and analysis system of FIG. 2.
Figure 4:
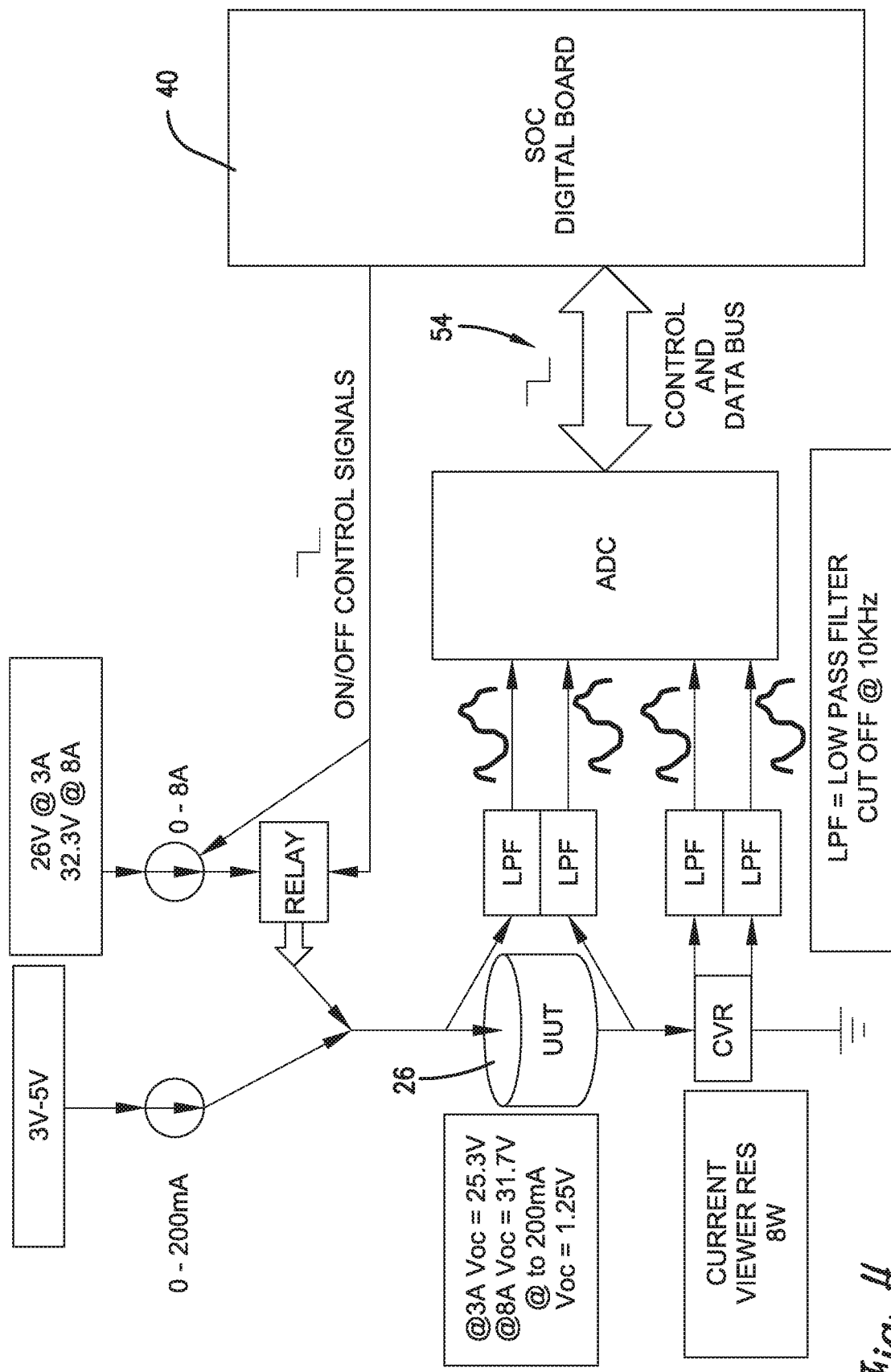
FIG. 4 is a high-level block diagram of a circuit resistance/interface component of the data acquisition and analysis system of FIG. 3.
Figure 5:
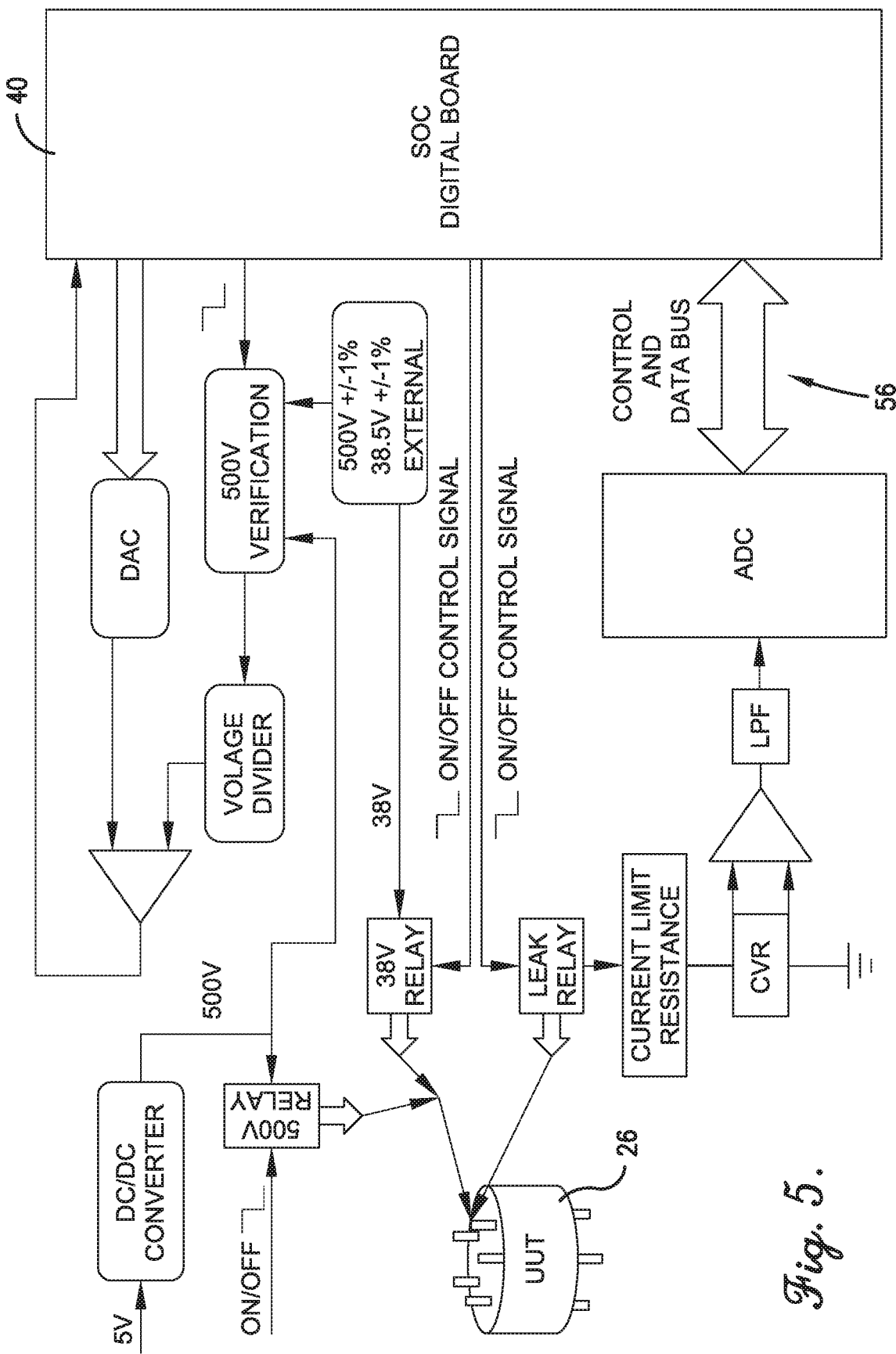
FIG. 5 is a high-level block diagram of an insulation resistance component of the data acquisition and analysis system of FIG. 3.

Referring also to FIGS. 3-5, a particular machine implementation of the iDAQ system 26 may include a system-on-chip (SoC) component 40, a power supply 42, a circuit resistance/interface (CR/I) component 44, an insulation resistance (IR) component 46, and a single enclosure 48. The SoC component 40 may be configured to control in real-time the data acquisition process, including sending enablement signals to the CR/I and IR components 44, 46, to perform the in situ data acquisition, and to perform the real-time analysis of the acquired data. The SoC component 40 may be substantially any suitable unmodified off-the-shelf (OTS), modified OTS, or custom technology. In one implementation, the SoC component 40 may include a ZYNQ-7000 all programmable SoC board having an ARM Cortex-9 666 MHz microprocessor, 1 GB of DDR3 RAM, Ethernet 10/100-based capability, and approximately 200 user I/O pins.

The power supply 42 may be electrically connected and provide voltage and current to the other components 40, 44, 46. The power supply 42 may be substantially any suitable unmodified OTS, modified OTS, or custom technology configured or configurable to provide both relatively high currents and voltages and relatively low currents and voltages. In one implementation, a high current/voltage subcomponent 50 may include six 0A to 9A individually enabled and programmable current sources, with one N6766A module per current source, and one current source per UUT circuit; 26V or 32.3V supply rails; and LED high current indicators. In one implementation, a low current/voltage subcomponent 52 may supply the necessary voltage rails to the SoC component 40, the CR/I component 44, and the IR board 46, and may include 5V, 8V, 12V, and 40V inputs; 3.3V (analog 1.5 A, digital 800 mA), 5V (analog 1.5 A, digital 800 mA), 12V (maximum 3 A), 37.65V (maximum 50 mA), and 38.5V (maximum 50 mA) outputs; isolated analog and digital grounds; and LED active rail indicators.

Referring particularly to FIG. 4, the CR/I component 44 may be electrically connected to the SoC component 40 by first control and data buses 54 and electrically connected to the UUT 26, and configured to acquire certain desired, needed, or otherwise relevant first data from the UUT 26, including first data regarding an electrical resistance for the UUT 26, and communicate the acquired first data to the SoC component 40 for the real-time analysis. The CR/I component 44 may be substantially any suitable unmodified OTS, modified OTS, or custom technology. In one implementation, the CR/I component 44 may include the following. Low current and high current four-wire resistance measurement circuits, including four circuit for high current and one circuit for the resistance measurement circuit, may be included for making measurements based on a voltage reference technique. Isolated analog and digital grounds may be included. Eighteen-bit 18-bit resolution wide common mode range analog-to-digital converters (ADCs) and 16-bit resolution digital-to-analog converters (DACs) may be included. Current viewing resistors (CVRs) with 1 Ohm, 8 W, 0.02% ppm may be included. Solid state relays may be included for enabling and disabling the high currents and preventing the five hundred volts (IR test) from reaching the board circuits. Protection for the high and low current circuits against reverse direction currents may be included.

Referring particularly to FIG. 5, the IR component 46 may be electrically connected to the SoC component 40 by second control and data buses 56 and electrically connected to the UUT 26, and configured to acquire certain desired, needed, or otherwise relevant second data from the UUT 26, including second data regarding an electrical insulation integrity for the UUT 26, and communicate the acquired second data to the SoC component 40 for real-time data analysis. The IR component 46 may be substantially any suitable unmodified OTS, modified OTS, or custom technology. In one implementation, the IR component 46 may include the following. Leakage current measurement circuits may be included, wherein these measurements may be based on a low side current sense technique. A 16-bit resolution DAC may be included. A 5V-to-500V DC/DD converter may be included. The low current subcomponent 52 of the power supply 42 may provide 38.5V for dynamic IR and 5V to the IR component 46. Solid state relays may be included to isolate the circuits and END/DIS high voltages. UUT pins may be included which can be connected to 500V or 38.5V or leakage measurement. Each pin, including the case ground pin, may be individually accessible. Solid state relays may be included to direct the pin connections and prevent enabling two or more solid state relays to the same pin at any time. Verification circuits may be included containing DACs and comparators to verify the 500V and the 38.5V using a reference voltage measurement technique. Current may be limited to 1 mA for the 500V measurement. A dynamic case short study may be performed using the 38.5V input.

The single enclosure 48 may be substantially any suitable unmodified OTS, modified OTS, or custom single enclosure technology configured or configurable to physically enclose, support, and otherwise maintain at least the SoC component 40, the power supply 42, the CR/I component 44, and the IR component 46, and in some implementations, the transceiver 32. The term "single" in this context shall mean that the other components are enclosed within a relatively compact space (as opposed to being spaced apart or even remotely located from one another) having reasonably defined outer walls. The term "single" may not preclude the existence of one or more interior walls or other partitions within the enclosure 48, so that one or more or all of the other components may have their own individual housings but these housings are connected together so as to effectively form a recognizably single enclosure 48.

In operation, the UUT 26 may be positioned and secured in the retention mechanism 36 and the centrifuge apparatus or other dynamic testing component 22 may be started so as to apply a stimulus to the UUT 26. The iDAQ system 24 may then acquire data from the UUT 26 in situ and analyze the acquired data in real-time. The iDAQ system 24 may control the stimulus, and may also be subject to the stimulus. The results of the real-time analysis of the acquired data may be electronically stored and/or electronically reported as desired or needed, including reporting by the transceiver 32 via the communication network 34 to a remote location. It will be appreciated that substantially any additional desired, needed, or otherwise relevant measurements or other performance evaluations may be performed by the iDAQ system 24.

Although the invention has been described with reference to the one or more embodiments illustrated in the figures, it is understood that equivalents may be employed and substitutions made herein without departing from the scope of the invention as recited in the claims.

ADDITIONAL CONSIDERATIONS

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments but is not necessarily included. Thus, the current technology can include a variety of combinations and/or integrations of the embodiments described herein.

Although the present application sets forth a detailed description of numerous different embodiments, the legal scope of the description is defined by the words of the claims set forth at the end of this patent and equivalents. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of routines, subroutines, applications, or instructions. These may constitute either software (e.g., code embodied on a machine-readable medium or in a transmission signal) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as computer hardware that operates to perform certain operations as described herein.

In various embodiments, computer hardware, such as a processing element, may be implemented as special purpose or as general purpose. For example, the processing element may comprise dedicated circuitry or logic that is permanently configured, such as an application-specific integrated circuit (ASIC), or indefinitely configured, such as an FPGA, to perform certain operations. The processing element may also comprise programmable logic or circuitry (e.g., as encompassed within a general-purpose processor or other programmable processor) that is temporarily configured by software to perform certain operations. It will be appreciated that the decision to implement the processing element as special purpose, in dedicated and permanently configured circuitry, or as general purpose (e.g., configured by software) may be driven by cost and time considerations.

Accordingly, the term "processing element" or equivalents should be understood to encompass a tangible entity, be that an entity that is physically constructed, permanently configured (e.g., hardwired), or temporarily configured (e.g., programmed) to operate in a certain manner or to perform certain operations described herein. Considering embodiments in which the processing element is temporarily configured (e.g., programmed), each of the processing elements need not be configured or instantiated at any one instance in time. For example, where the processing element comprises a general-purpose processor configured using software, the general-purpose processor may be configured as respective different processing elements at different times. Software may accordingly configure the processing element to constitute a hardware configuration at one instance of time and to constitute a different hardware configuration at a different instance of time.

Computer hardware components, such as communication elements, memory elements, processing elements, and the like, may provide information to, and receive information from, other computer hardware components. Accordingly, the described computer hardware components may be regarded as being communicatively coupled. Where multiple of such computer hardware components exist contemporaneously, communications may be achieved through signal transmission (e.g., over appropriate circuits and buses) that connect the computer hardware components. In embodiments in which multiple computer hardware components are configured or instantiated at different times, communications between such computer hardware components may be achieved, for example, through the storage and retrieval of information in memory structures to which the multiple computer hardware components have access. For example, one computer hardware component may perform an operation and store the output of that operation in a memory device to which it is communicatively coupled. A further computer hardware component may then, later, access the memory device to retrieve and process the stored output. Computer hardware components may also initiate communications with input or output devices, and may operate on a resource (e.g., a collection of information).

The various operations of example methods described herein may be performed, at least partially, by one or more processing elements that are temporarily configured (e.g., by software) or permanently configured to perform the relevant operations. Whether temporarily or permanently configured, such processing elements may constitute processing element-implemented modules that operate to perform one or more operations or functions. The modules referred to herein may, in some example embodiments, comprise processing element-implemented modules.

Similarly, the methods or routines described herein may be at least partially processing element-implemented. For example, at least some of the operations of a method may be performed by one or more processing elements or processing element-implemented hardware modules. The performance of certain of the operations may be distributed among the one or more processing elements, not only residing within a single machine, but deployed across a number of machines. In some example embodiments, the processing elements may be located in a single location (e.g., within a home environment, an office environment or as a server farm), while in other embodiments the processing elements may be distributed across a number of locations.

Unless specifically stated otherwise, discussions herein using words such as "processing," "computing," "calculating," "determining," "presenting," "displaying," or the like may refer to actions or processes of a machine (e.g., a computer with a processing element and other computer hardware components) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The patent claims at the end of this patent application are not intended to be construed under 35 U.S.C. § 112(f) unless traditional means-plus-function language is expressly recited, such as "means for" or "step for" language being explicitly recited in the claim(s).

Although the invention has been described with reference to the embodiments illustrated in the attached drawing figures, it is noted that equivalents may be employed and substitutions made herein without departing from the scope of the invention as recited in the claims.

Having thus described one or more embodiments of the invention, what is claimed as new and desired to be protected by Letters Patent includes the following:

1. A data acquisition and analysis system for improving the testing of a product unit including performing in situ acquisition of data for the product unit, while a dynamic testing component applies a stimulus to the product unit, and real-time analysis of the data, the data acquisition and analysis system comprising:
   a processor component configured to control in real-time the in situ acquisition of the data, to perform in real-time the in situ acquisition of the data, and to perform the real-time analysis of the data;
   a power supply including a high current/voltage subcomponent and a low current/voltage subcomponent;
   a circuit resistance/interface component electrically connected to the processor component and the power supply and configured to acquire first data from the product unit, including first data regarding an electrical resistance for the product unit, while the stimulus is applied to the product unit, and to communicate the first data to the processor component for the real-time analysis;
   an insulation resistance component electrically connected to the processor component and the power supply and configured to acquire second data from the product unit, including second data regarding an electrical insulation integrity for the product unit, while the stimulus is applied to the product unit, and to communicate the second data to the processor component for the real-time analysis; and
   an enclosure physically enclosing the processor component, the power supply, the circuit resistance/interface component, and the insulation resistance component.

2. The data acquisition and analysis system of claim 1, wherein the dynamic testing component is a centrifuge configured to apply a centrifugal force to the product unit.

3. The data acquisition and analysis system of claim 1, wherein the stimulus is also applied to the data acquisition and analysis system.

4. The data acquisition and analysis system of claim 1, wherein the processor component is a system-on-chip.

5. The data acquisition and analysis system of claim 1, wherein the processor component is further configured to control the dynamic testing component, including varying in real-time the stimulus applied to the product unit.

6. The data acquisition and analysis system of claim 1, wherein the system-on-chip component includes multiple input channels configured to receive in real-time the data.

7. The data acquisition and analysis system of claim 1, wherein the high current/voltage subcomponent of the power supply is configured to supply up to five hundred volts, and the data acquisition and analysis system is further configured to measure on multiple input channels a leakage current of the product unit.

8. The data acquisition and analysis system of claim 1, further including a transceiver configured to transmit and receive information into and out of the testing system via a communication network, including information for controlling the dynamic testing component and the data acquisition and analysis system.

9. A data acquisition and analysis system for improving the testing of a product unit including performing in situ acquisition of data for the product unit, while a dynamic testing component applies a stimulus to the product unit, and real-time analysis of the data, the data acquisition and analysis system comprising:
   a processor component configured to vary in real-time the stimulus applied by the dynamic testing component to the product unit, control in real-time the in situ acquisition of the data, to perform in real-time the in situ acquisition of the data on multiple input channels, and to perform the real-time analysis of the data;
   a power supply including a high current/voltage subcomponent and a low current/voltage subcomponent, wherein the high current/voltage subcomponent of the power supply is configured to supply up to five hundred volts, and the data acquisition and analysis system is configured to measure on multiple input channels a leakage current of the product unit;
   a circuit resistance/interface component electrically connected to the processor component and the power supply and configured to acquire first data from the product unit, including first data regarding an electrical resistance for the product unit, while the stimulus is applied to the product unit, and to communicate the first data to the processor component for the real-time analysis;

an insulation resistance component electrically connected to the processor component and the power supply and configured to acquire second data from the product unit, including second data regarding an electrical insulation integrity for the product unit, while the stimulus is applied to the product unit, and to communicate the second data to the processor component for the real-time analysis; and a single enclosure physically enclosing the processor component, the power supply, the circuit resistance/interface component, and the insulation resistance component.

10. The data acquisition and analysis system of claim 9, wherein the dynamic testing component is a centrifuge configured to apply a centrifugal force to the product unit.

11. The data acquisition and analysis system of claim 9, wherein the stimulus is also applied to the data acquisition and analysis system.

12. The data acquisition and analysis system of claim 9, wherein the processor component is a system-on-chip.

13. The data acquisition and analysis system of claim 9, further including a transceiver configured to transmit and receive information into and out of the testing system via a communication network, including information for controlling the dynamic testing component and the acquisition and analysis of the data.

14. A testing system for improving the testing of a product unit, including performing in situ acquisition of data and real-time analysis of the data, the testing system comprising:

a dynamic testing component configured to apply a stimulus to the product unit; and a data acquisition and analysis system configured to perform the in situ acquisition of the data and the real-time analysis of the data, the data acquisition and analysis system including— a system-on-chip component configured to control in real-time the in situ acquisition of the data, to perform in real-time the in situ acquisition of the data, and to perform the real-time analysis of the data, a power supply including a high current/voltage subcomponent and a low current/voltage subcomponent, a circuit resistance/interface component electrically connected to the system-on-chip component and the power supply and configured to acquire first data from the product unit, including first data regarding an electrical resistance for the product unit, while the stimulus is applied to the product unit, and to communicate the first data to the system-on-chip component for the real-time analysis, an insulation resistance component electrically connected to the system-on-chip component and the power supply and configured to acquire second data from the product unit, including second data regarding an electrical insulation integrity for the product unit, while the stimulus is applied to the product unit, and to communicate the second data to the system-on-chip component for the real-time analysis, and a single enclosure physically enclosing the system-on-chip component, the power supply, the circuit resistance/interface component, and the insulation resistance component.

15. The testing system of claim 14, wherein the dynamic testing component is a centrifuge configured to apply a centrifugal force to the product unit.

16. The testing system of claim 14, wherein the stimulus is also applied to the data acquisition and analysis system.

17. The testing system of claim 14, wherein the system-on-chip component is further configured to control the dynamic testing component, including varying in real-time the stimulus applied to the product unit.

18. The testing system of claim 14, wherein the system-on-chip component includes multiple input channels configured to receive in real-time the data.

19. The testing system of claim 14, wherein the high current/voltage subcomponent of the power supply is configured to supply up to five hundred volts, and the data acquisition and analysis system is further configured to measure on multiple input channels a leakage current of the product unit.

20. The testing system of claim 14, further including a transceiver configured to transmit and receive information into and out of the testing system via a communication network, including information for controlling the dynamic testing component and the data acquisition and analysis system.

* * * * *